(12) United States Patent
Soulier et al.

(10) Patent No.: US 12,406,811 B2
(45) Date of Patent: Sep. 2, 2025

(54) DEVICE HAVING AN ANODIC POROUS REGION SURROUNDED BY A TRENCH HAVING AN ELECTRICAL ISOLATION BARRIER

(71) Applicant: Murata Manufacturing Co., Ltd., Nagaokakyo (JP)

(72) Inventors: Brigitte Soulier, Grenoble (FR); Frédéric Voiron, Barraux (FR)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 297 days.

(21) Appl. No.: 18/153,585

(22) Filed: Jan. 12, 2023

(65) Prior Publication Data
US 2023/0197440 A1 Jun. 22, 2023

Related U.S. Application Data

(63) Continuation of application No. PCT/IB2021/056253, filed on Jul. 12, 2021.

(30) Foreign Application Priority Data

Jul. 13, 2020 (EP) ..................................... 20305800

(51) Int. Cl.
*H01G 4/33* (2006.01)
*C25D 11/02* (2006.01)
*C25D 11/04* (2006.01)
*H10D 1/00* (2025.01)
(Continued)

(52) U.S. Cl.
CPC .............. *H01G 4/33* (2013.01); *C25D 11/022* (2013.01); *C25D 11/045* (2013.01); *H10D 1/043* (2025.01); *H10D 1/716* (2025.01); *H01G 4/10* (2013.01)

(58) Field of Classification Search
None
See application file for complete search history.

(56) References Cited

U.S. PATENT DOCUMENTS 10,497,582 B2 12/2019 Voiron et al.
2007/0040204 A1* 2/2007 Pulugurtha ............ H10D 86/01
257/303

(Continued)

FOREIGN PATENT DOCUMENTS

EP 3567645 A1 11/2019
WO 2015063420 A1 5/2015

OTHER PUBLICATIONS

International Search Report issued for PCT/IB2021/056253, date of mailing Oct. 14, 2021.

(Continued)

*Primary Examiner* — Eric W Thomas
(74) *Attorney, Agent, or Firm* — ArentFox Schiff LLP

(57) ABSTRACT

An electrical device that includes: a metal barrier layer; an anodic porous oxide region on the metal barrier layer; a trench around the anodic porous oxide region reaching the metal barrier layer; a liner at least on a wall of the trench on a side of the anodic porous oxide region forming an electrical isolation barrier and having an opening onto the anodic porous oxide region; a hard mask arranged above the trenches and the liner having an opening onto the anodic porous oxide region. A corresponding manufacturing method is also disclosed.

15 Claims, 4 Drawing Sheets

(51) Int. Cl.
    *H10D 1/68*      (2025.01)
    *H01G 4/10*      (2006.01)

(56) References Cited

U.S. PATENT DOCUMENTS

2013/0329337 A1\* 12/2013 Masuda ................ H01G 4/232
                                                                     361/303
2016/0233025 A1\* 8/2016 Masuda .................. H01G 4/06

OTHER PUBLICATIONS

Park, Sang-Hyun et al., "The Formation of Porous Anodic Aluminum Oxide Confined in um-Size Contact and Trench Patterns", Electrochemical and Solid-State Letters, vol. 9, No. 12, 2006, pp. D31-D33.

Brevnov, Dmitri A., "Electrochemical Micromachining of Patterned Aluminum Films by Porous-type Anodization", ECS Transactions, vol. 3, No. 16, 2007, pp. 11-17.

Banerjee, P. et al.; "Nanotubular metal-insulator-metal capacitor arrays for energy storage"; Nature Nanotechnology, vol. 4, May 2009, pp. 292-296.

\* cited by examiner

DEVICE HAVING AN ANODIC POROUS REGION SURROUNDED BY A TRENCH HAVING AN ELECTRICAL ISOLATION BARRIER

CROSS REFERENCE TO RELATED APPLICATIONS

The present application is a continuation of International application No. PCT/IB2021/056253, filed Jul. 12, 2021, which claims priority to European Patent Application No. 20305800.3, filed Jul. 13, 2020, the entire contents of each of which are incorporated herein by reference.

FIELD OF THE INVENTION

The present invention relates to the field of integration and, more particularly, to electrical devices including anodic porous oxides and their methods of manufactures.

TECHNICAL BACKGROUND

Silicon passive integration technologies are nowadays accessible for industrial design. For example, the PICS technology developed by Murata Integrated Passive Solutions allows integrating high density capacitive components into a silicon substrate. According to this technology, tens or even hundreds of passive components can be efficiently integrated into a silicon die.

In their work titled "Nanotubular metal-insulator-metal capacitor arrays for energy storage" (published in Natural technology, May 2009), P. Banerjee et al. describe a metal-insulator-metal (MIM) structure formed in a porous anodic material, such as porous anodic alumina (PAA) for example. The successive layers of metal, insulator, and then metal follow the contours of the porous material resulting in the MIM structure being embedded inside the pores of the porous material. Banerjee's PAA embedded structure however suffers from high Equivalent Series Resistance (ESR) and limited capacitance density due to the PAA thickness that can be deposited by Atomic Layer Deposition (ALD).

A structure by F. Voiron et al. that improves Banerjee's ESR and capacitance is described in international application publication WO 2015/063420 A1. Voiron's structure results in highly integrated capacitance that may be used in a variety of applications. In this structure the bottoms of the pores are opened and the lower metal layer of the MIM structure contacts a conductive layer that underlies the porous region, providing electrical contact and reducing ESR.

Generally, PAA embedded structures as described above result from embedding a structure (e.g., a MIM capacitive stack) inside a porous region above a substrate, such as a silicon wafer. Typically, the porous region results from anodizing a thin layer of metal, such as aluminum, deposited above the substrate. The anodization converts the aluminum layer into porous anodic alumina. Typically, the porous region is formed with any shape (as viewed from the top) and extends across the alumina layer in a direction perpendicular to the wafer surface.

Delimiting the shape of the porous anodic alumina can be performed by forming a hard mask having an opening onto the region which is to be anodized.

FIG. 1 is a TEM image of a cross-section which illustrates the hard mask interface region of an example porous region formed using a silicon dioxide hard mask over an aluminum layer. As shown in this figure, the pores which are remote from the hard mask interface region (on the right side of the figure) are substantially straight, vertical, and extend throughout the entire thickness of the layer.

Around the hard mask interface region, pores are bent so as to become nearly horizontal and therefore cannot reach the bottom of the layer in which anodization is performed. These bends result from the distribution of the anodization electrical field. Bellow the bends of the pores, a bevel of the anodic region can be observed. This bevel can lead to a planarity defect.

Also, the bent pores are non-uniform in terms of shape (i.e., depth, diameter, orthogonality to the substrate), which make the contribution of this interface region to the electrical value of the subsequently formed electrical component difficult to quantify. For example, it is difficult to determine how the pores at the interface region will be filled by a stack of conductive layer, insulator, and conductive layer to contribute to the capacitance of a capacitor formed above the porous region.

From the prior art, document EP 3 567 645 discloses a device which overcomes this lack of accuracy by using a second hard mask to delimit the area of the porous region which will be subsequently used in an electrical component.

On FIG. 2, a SEM image of a cross section illustrates how the second hard mask HM2 covers the interface region AAO which is beveled around the interface of the first hard mask HM1.

This allows only using vertical and straight pores in the subsequently formed electrical component.

However, and as can be seen on the figure, planarity defects may still be present.

It can be conceived that this solution results in a lack of usable surface or footprint for the subsequently formed components.

By way of example, the distance between the edge of the first hard mark HM1 and the edge of the second hard mask HM2 can be of the order of 30 micrometers for a device in which the layer to be anodized is a 10 micrometer thick aluminum layer.

While 30 micrometer is a distance which provides a good protection, for smaller capacitors (in terms of footprint, for example less than 0.1 or 0.05 square millimeters), it also leads to an area which is mostly occupied by the second hard mask and a great loss of capacitance. This loss decreases for bigger capacitors.

It has been observed that for a given capacitance value using this 30 micrometers distance, it is possible to use a thinner aluminum layer if the distance is reduced to 10 micrometers.

Using a thinner aluminum layer is desirable as it decreases the duration of the anodization, and of the subsequent deposition steps occurring inside the pores.

From the above, it appears that there is a need for a technique which limits the surface area occupied by unusable pores (i.e. bent pores), which limits planarity defects, and which allows using thinner metal layer for anodization.

The present invention has been made in light of the above problems.

SUMMARY OF THE INVENTION

The present invention provides an electrical device comprising: a metal barrier layer; an anodic porous oxide region on the metal barrier layer; a trench around the anodic porous oxide region reaching the metal barrier layer; a liner at least on the wall of the trench on the side of the anodic porous oxide region forming an electrical isolation barrier and having an opening onto the anodic porous oxide region; and a hard mask arranged above the trenches and the liner having at least an opening onto the anodic porous oxide region (for example aligned with the opening of the liner).

Thus, the present invention proposes to avoid using a first and a second hard mask, and instead proposes to form an insulating trench around the anodic porous oxide region.

It has been observed by the inventors of the present invention that a liner which forms an electrical isolation barrier which decreases the amplitude of the horizontal component (i.e. perpendicular to the direction in which the pores extend in the anodic porous region) of the electrical field during anodization around the edges of the region to be anodized. Consequently, only straight pores are formed in a direction which is perpendicular to the surface of the barrier layer (i.e. vertical).

Thus, the planarity defect is overcome, the loss of usable anodic oxide layer is also overcome, and this also leads to allowing reducing the thickness of the layer to be anodized to obtain electrical components having the same electrical value.

For example, it is possible to obtain a capacitor having a given capacitance value with a thinner layer to be anodized compared to a capacitor using two hard masks and a 30 micrometers distance between the edges of the hard masks.

By around the anodic porous oxide region, what is meant is that the trench forms a closed ring having any shape around the anodic porous oxide region. Also, the trench extends in the entire thickness of the layer which has been anodized to obtain the anodic porous oxide region.

It should be noted that in the above device, the hard mask is the one which will delimit the area to be anodized. If the edges of the opening of the hard mask are in the vicinity of the trench then this will greatly limit, as explained above, the amplitude of the horizontal component of the electrical field.

By way of example, in the present application, anodic porous oxide regions are regions which initially comprised a metal, for example aluminum, and which have been anodized so as to comprise straight pores extending from a top surface (for example accessible by the electrolyte during the anodization process) in a direction which is substantially perpendicular to the plane on which the initial metal layer to be anodized is deposited.

In particular, an anodized metal can be identified as such because the pores extend in a substantially straight direction when formed in a metal such as aluminum or tantalum (for tantalum: C. F. Almeida Alves, S. Calderon V., P. J. Ferreira, L. Marques, S. Carvalho, Passivation and dissolution mechanisms in ordered anodic tantalum oxide nanostructures, Applied Surface Science, Volume 513, 2020, 145575, ISSN 0169-4332), because the openings of the pores can be arranged following a substantially hexagonal compact scheme, and because they are formed by an oxide surrounding the pores which can be surrounded by the non-anodized metal (if a mask is used).

The anodic porous oxide regions can also be identified because the pores have an opening diameter comprised between 10 and 150 nanometers.

According to a particular embodiment, the liner is arranged on both walls of the trench and on the bottom of the trench in a conformal manner.

In this particular embodiment, the liner may or may not completely fill the trench.

A conformal liner ensures that the anodic porous oxide region is well surrounded by an electrical insulator.

According to a particular embodiment, the thickness of the hard mask is chosen so as to be greater than half of the width of the void in the trench at least partially filled with the liner.

This particular embodiment ensures that the void in the trench is filled by the hard mask. Consequently, a more planar device is obtained which leads to a better yield.

According to a particular embodiment, the liner is deposited so that a first remaining trench is arranged in the trench (for example by choosing a specific thickness and/or specific deposition parameters to control the conformality) and: the hard mask comprises an additional opening at the level of the first remaining trench, or the thickness of the hard mask is chosen so that a second remaining trench is arranged in the first remaining trench.

This particular embodiment ensures that a vertical hole will be present inside the first remaining trench (after the liner has been deposited) or inside the second remaining trench (after the hard mask has been deposited on the walls and on the bottom of the first remaining trench without filling the first remaining trench). This vertical hole is therefore adapted to be filled with electrolyte during an anodizing step, which implies that the electrical potential inside the vertical hole is the same as the electrical potential inside the pores that are being formed: this limits the horizontal component of the electrical field at the level of the outer borders of the anodic porous oxide region. Consequently, more vertical pores are formed.

This particular embodiment is advantageous when the liner comprises an insulating material such as silicon dioxide, as materials such as tungsten or molybdenum are (at least for the non-anodized portion) may be connected to the anodic potential.

According to a particular embodiment, the aspect ratio of the trench is below 2.

The aspect ratio is the depth of the trench divided by the width of the trench. This aspect ratio facilitates a conformal deposition of liner.

According to a particular embodiment, the edge of the opening of the hard mask is aligned with the wall of the trench on the side of the anodic porous oxide region or spaced by a given distance from the wall of the trench on the side of the anodic porous oxide region in the direction of the center of this region.

The given distance ensures that the wall of the trench on the side of the anodic porous oxide region is covered by the hard mask, and that no electrolyte will penetrate the trench during the anodization.

According to a particular embodiment, the given distance is around 500 nanometers.

This distance has been observed to allow covering the wall of the trench on the side of the anodic porous oxide region without occupying too much area which could contribute to a subsequently formed electrical component.

According to a particular embodiment, the liner comprises silicon dioxide or silicon nitride or molybdenum or tungsten.

Silicon dioxide or silicon nitride can be used as a liner because of their dielectric properties.

Molybdenum may also be used as it will anodize quickly at the interface of the wall so as to form an isolation barrier when electrolyte reaches its surface. Moreover, the thickness of the anodized molybdenum may be of the order of several nanometers, which may be sufficient to act as an electrical isolation barrier. Tungsten may also anodize quickly in a similar manner.

According to a particular embodiment, the anodic porous oxide region comprises alumina.

The anodizing step therefore comprises anodizing an aluminum layer.

According to a particular embodiment, the device further comprises a capacitor including a first conductive layer, a first insulator layer covering the first conductive layer, and a second conductive layer covering the first insulator layer, the capacitor being formed inside pores of the anodic porous oxide region.

The invention is however not limited to device including capacitors and may also include other components formed inside the pores of the anodic porous oxide region.

The invention also provides a method of manufacturing an electrical device comprising an anodic porous oxide region comprising: forming an anodizable metal layer on a metal barrier layer; forming a trench in the anodizable metal layer around a portion of the anodizable metal layer which will include the anodic porous oxide region after anodizing, the trench reaching the metal barrier layer; forming a liner at least on the wall of the trench on the side of the portion of the anodizable metal layer having an opening onto the anodic porous oxide region; forming a hard mask above the trenches and the liner, having at least an opening onto the portion of the anodizable metal layer; and anodizing the portion of the anodizable metal layer so as to obtain the anodic porous oxide region, wherein the liner forms an electrical isolation barrier around the anodic porous oxide region.

This method can be adapted to manufacture any one of the embodiments of the above-defined device.

The portion of the anodizable metal layer can have the same shape as the final anodic porous oxide region, or it can be smaller if the edge of the opening is closer to the center of the portion of the anodizable metal layer which is defined by the trench.

Also, the liner may form an electrical isolation barrier at least during a portion of the anodizing step. This is the case if molybdenum or tungsten is used as a liner, is will anodize to form a barrier.

It should be noted that the openings in the liner and in the hard mask can be formed simultaneously. For example, a layer of liner is deposited, a layer of hard mask is deposited, and the two openings are formed in a single etching step.

According to a particular embodiment, forming the liner comprises depositing the liner on both walls of the trench and on the bottom of the trench in a conformal manner.

According to a particular embodiment, the edge of the opening of the hard mask is aligned with the wall of the trench on the side of the portion of the anodizable layer or spaced by a given distance from the wall of the trench on the side of the portion of the anodizable layer in the direction of the center of this portion.

According to a particular embodiment, forming the liner comprises depositing silicon dioxide or silicon nitride or molybdenum or tungsten.

According to a particular embodiment, the method further comprises forming a capacitor including: forming a first conductive layer, forming a first insulator layer covering the first conductive layer, and forming a second conductive layer covering the first insulator layer, the capacitor being formed inside pores of the anodic porous oxide region.

BRIEF DESCRIPTION OF THE DRAWINGS

Further features and advantages of the present invention will become apparent from the following description of certain embodiments thereof, given by way of illustration only, not limitation, with reference to the accompanying drawings in which.

DETAILED DESCRIPTION OF EXAMPLE EMBODIMENTS

We will now describe an electrical device comprising an anodic porous oxide region, and the corresponding manufacture method.

In the present description, anodic porous oxide regions are regions which initially comprised a metal, for example aluminum, and which have been anodized so as to comprise straight pores extending from a top surface in the entire thickness of the layer, in a direction which is substantially perpendicular to the plane on which the layer is deposited.

The anodic porous oxide region can accommodate a capacitor inside the pores, for example is a stack of conductive layer, dielectric layer, and conductive layer is deposited in a conformal manner inside the pores. The invention is however not limited to devices comprising capacitors and is also directed to devices comprising other components inside pores.

Figure 1:
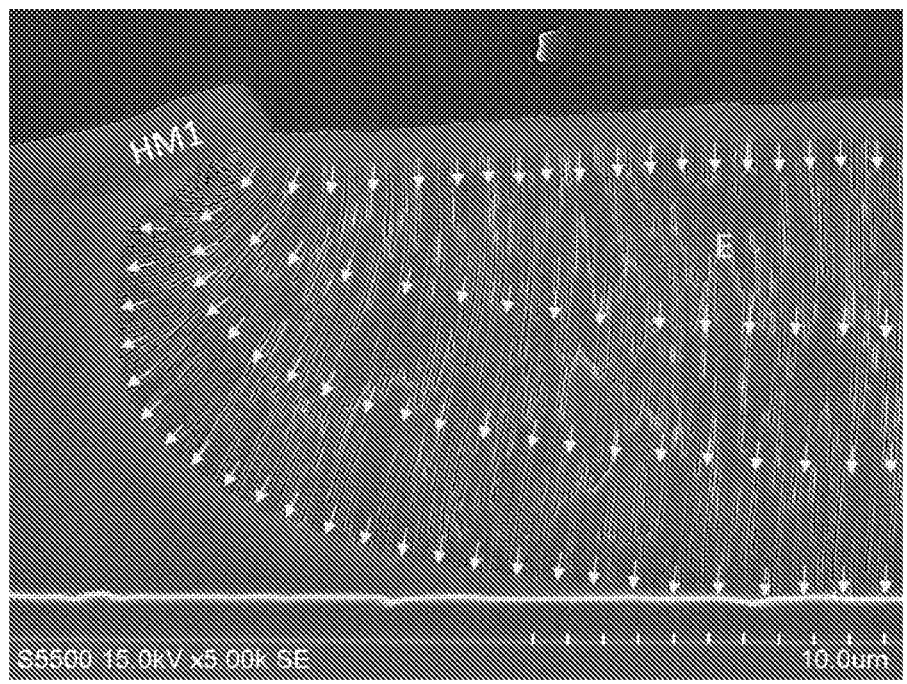
FIG. 1, already described, shows an anodized structure using a hard mask.
Figure 2:
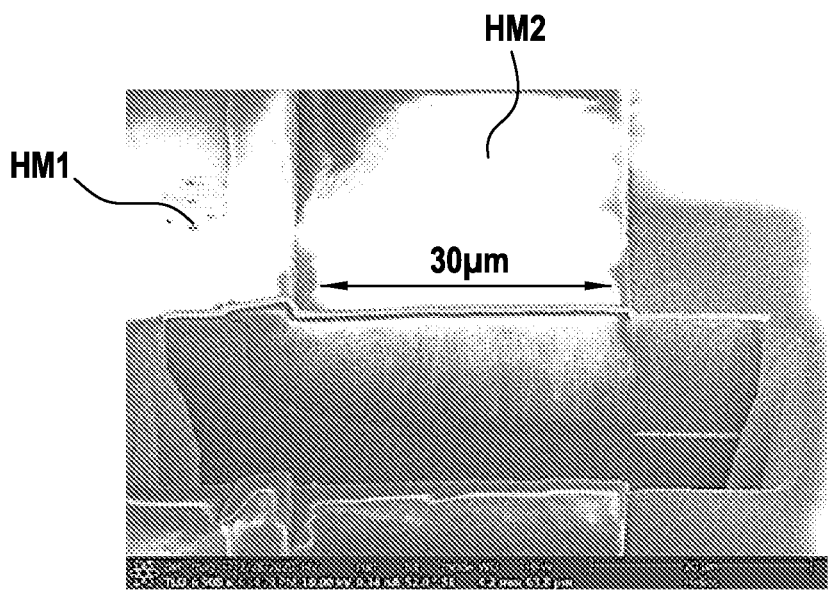
FIG. 2, already described, shows an anodized structure using two hard masks.
Figure 3:
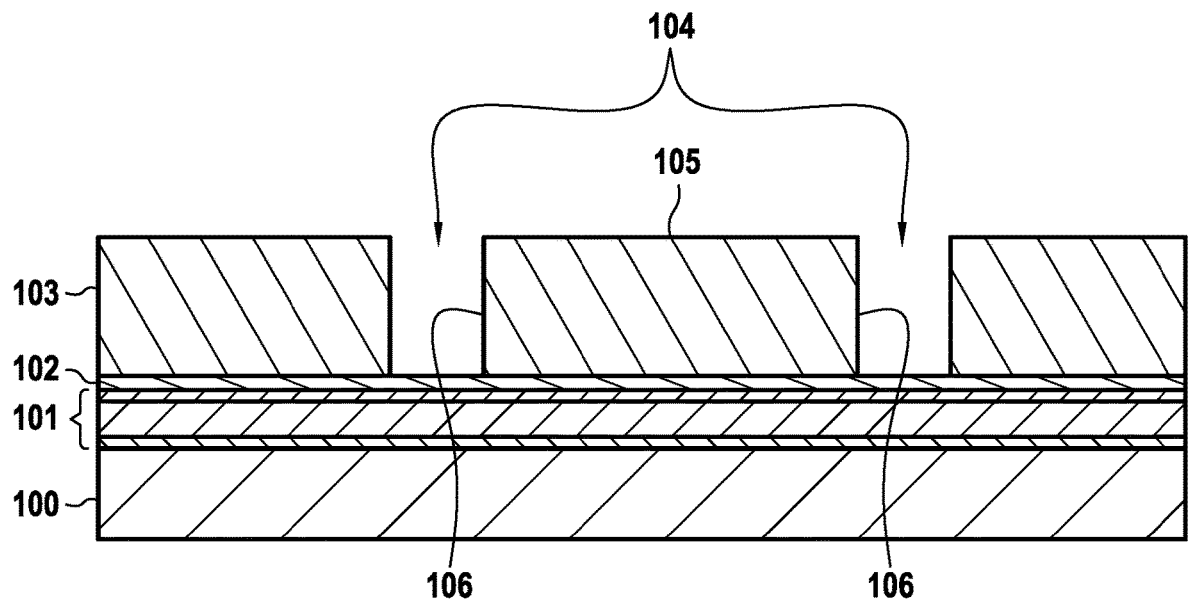
FIG. 3, is a schematic representation of a step of a method in which trenches are formed according to an example.

On FIG. 3, a silicon substrate 100 is shown. The device to be manufactured will be formed above this substrate. This substrate can be a 200 mm silicon wafer having a 725 μm thickness. Alternatively, the substrate can be made of glass or of any other suitable material.

In order to perform a subsequent anodization, a bottom electrode 101 is formed above the substrate 100. In the illustrate example, the bottom electrode 101 comprises a stack of materials, for example:

- A first layer of Ti/TiN (Titanium/Titanium Nitride) formed on the substrate 100 and having a thickness comprised between 40 and 60 nanometers,
- A second layer of combined Aluminum Copper (AlCu) formed on the first layer of Ti/Tin and having a thickness of around 3 micrometers, and
- A third layer of Ti/TiN (Titanium/Titanium Nitride) formed on the second layer and having a thickness comprised between 40 and 60 nanometers.

On the bottom electrode 101, a metal barrier layer 102 has been formed. In the illustrated example, this metal barrier layer is a Tungsten (W) layer having a thickness of about 300 nanometers. It should be noted that in the present description, the metal barrier layer is a layer which stops the progression of the anodization and prevents it from reaching the bottom electrode 101. Other materials may be used for this layer.

An anodizable metal layer 103, here an aluminum layer, has been formed on the metal barrier layer 102. This aluminum layer 103 will be partially and subsequently anodized. Its thickness can be of the order of 7 micrometers.

A trench 104 has been formed around a portion 105 of the aluminum layer 103. This trench extends from the top of the aluminum layer to the metal barrier layer 102, and its aspect ratio may be below 2 (depth divided by width of the trench) so as to facilitate its filling (or partial filling) in subsequent steps. It should be noted that the trench 104 is a single trench surrounding the portion 105.

Forming the trench may be performed using Reactive Ion Etching (RIE) or other dry-etching methods.

It should be noted that the portion 105 of the aluminum layer 103 forms an island within the aluminum layer 103: it is surrounded by:
- On its bottom, the metal barrier layer 102,
- On its top, the top of the aluminum layer, and
- On its side, the wall 106 of the trench 104 which is on the side of the portion. This wall forms encircles the portion.

Figure 4:
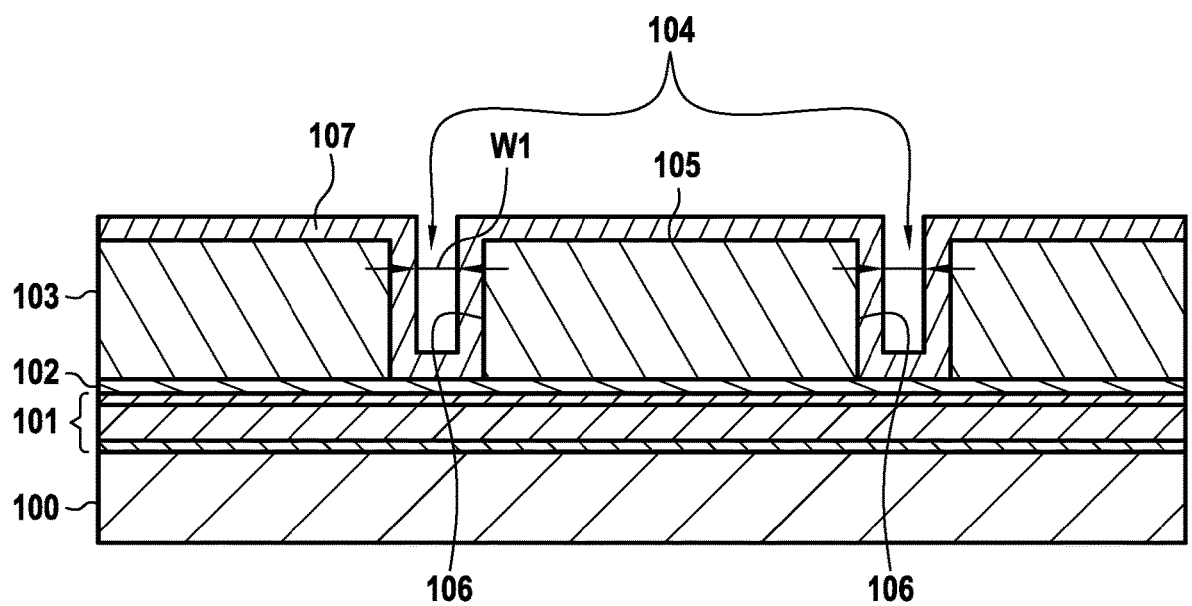
FIG. 4, is a schematic representation of a step of a method in which liner is deposited according to an example.

FIG. 4 shows the deposition of a liner 107 in a conformal manner over the aluminum layer 103, and in the trench 104.

For example, a conformal deposition can be obtained using a method such as Chemical Vapor Deposition (CVD) or Plasma Enhanced CVD (PECVD), to deposit a layer having a thickness of the order of 1 micrometer.

In the present example, silicon dioxide is the liner material. The invention is however not limited to using silicon dioxide and other insulating materials can be used such as silicon nitride. Alternatively, molybdenum or tungsten can be used as they will anodize quickly to form a barrier which will stop the further propagation of pores on the lateral axis (toward the trench).

Because the deposition step is conformal, the wall 106 of the trench which is on the side of the portion 105 is fully covered by the liner.

The width W1 of the void remaining in the trench after depositing the liner is preferably small, for example below 2 micrometers, or even below 1.5 micrometer. This fill ensure that a subsequent step will form a plug above the void.

This void forms a first remaining trench: a trench which remains after the liner has been deposited and which is present because the liner is thin.

Figure 5:
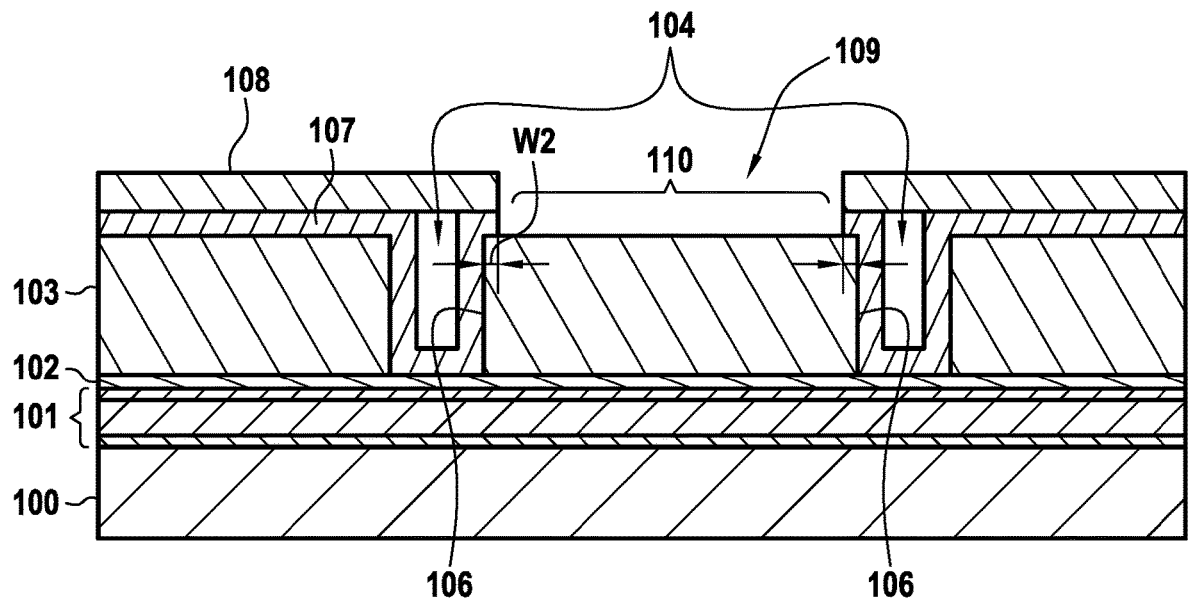
FIG. 5, is a schematic representation of a step of a method in which a hard mask is deposited according to an example.

As shown on FIG. 5, a hard mask 108 is deposited above the liner. This hard mask will delimit the region to be anodized. The hard mask is, in the illustrated example, a silicon dioxide layer having a thickness of 1 micrometer.

In order to delimit the region to be anodized, the hard mask 108 comprises an opening 109 which opens onto a region to be anodized 110. The opening 109 is also an opening going through the liner 107 and the hard mask and the liner can be patterned in a single step to form the opening 109.

It should be noted that while the opening 109 could have its edge aligned with the walls 106, it is preferable to space this edge towards the center of the region 110 to be anodized to overcome alignment issues. For example, this spacing W2 can be of the order of 500 nanometers. This value may be chosen in accordance with the specifications of the photolithography alignment step. Such a step is typically associated with a minimum spacing value.

As can be seen on the figure schematically, the hard mask plugs the voids in the trenches and a substantially horizontal surface is obtained above the trenches. Alternative embodiments will be described hereinafter in reference to FIGS. 7 and 8.

Figure 6:
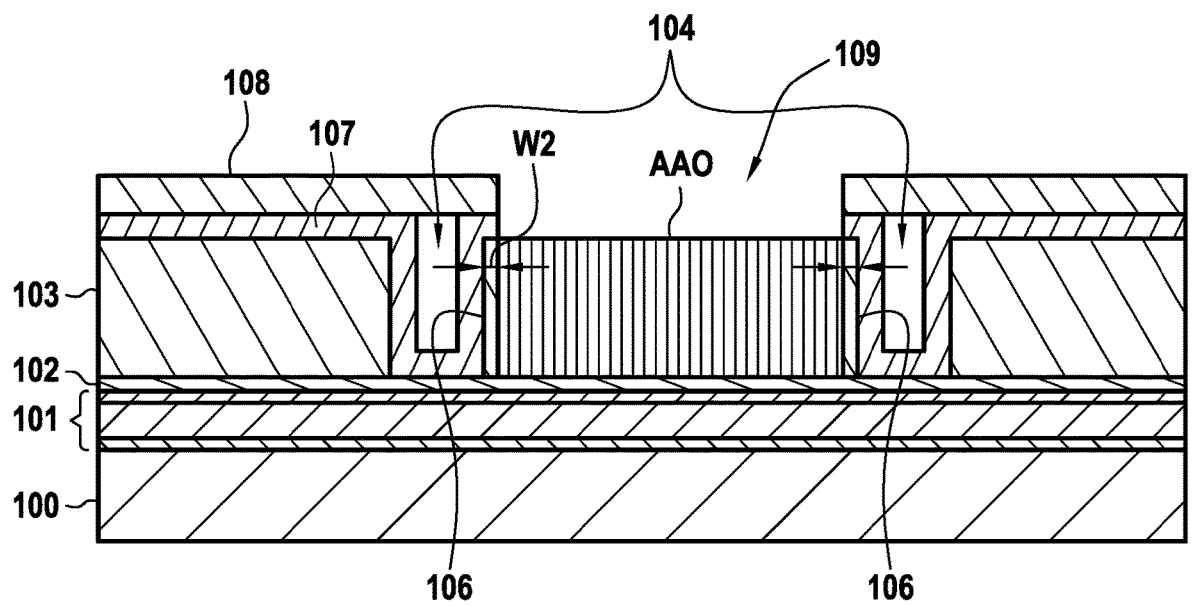
FIG. 6 is a schematic representation of the obtained device.

FIG. 6 shows the device obtained after an anodization step. Only vertical pores are obtained in the anodic porous oxide region AAO.

The liner deposited against the wall 106 decreases the amplitude of the horizontal component of the electrical field (because the difference of electrical potential will be spread over a large dielectric thickness, which lowers the resulting electrical field), which results in these vertical and straight pores.

Additionally, no bevel is observed and the planarity of the device is maintained.

A subsequent formation of a capacitor can be performed in the pores, with minimal loss of surface (mainly due to the trenches and the spacing W2).

Figure 7:
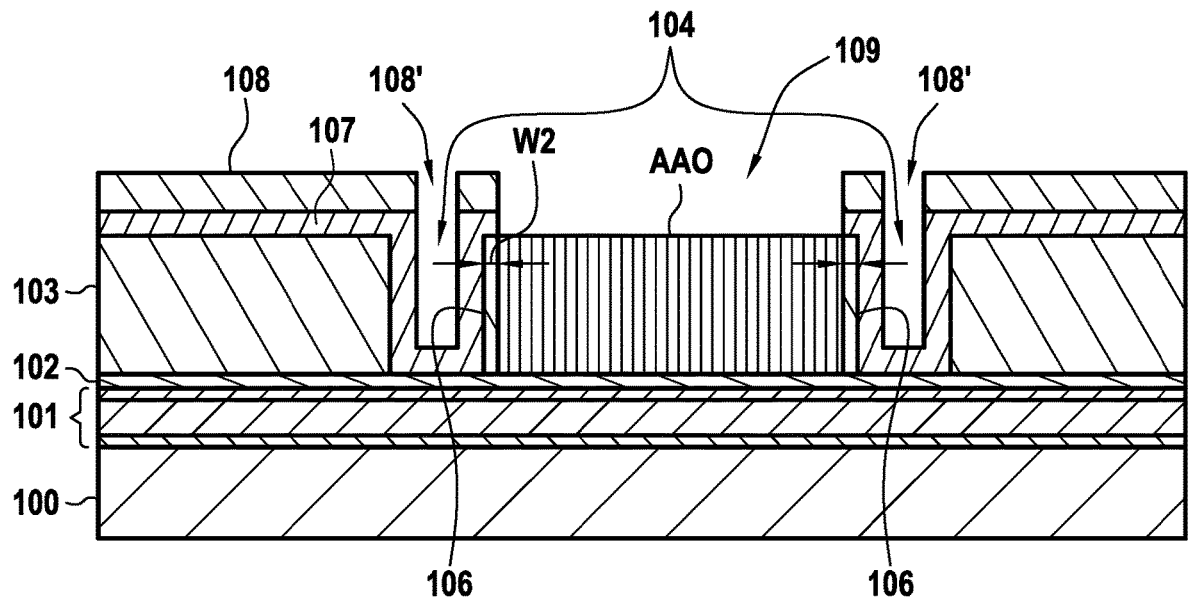
FIGS. 7 and 8 are alternative devices.

On FIG. 7, an alternative embodiment shows the device which can be obtained after the hard mask 108 has been patterned to form an additional opening 108' which opens onto the remaining trench. Patterning the hard mask 108 can be done when the opening 109 is formed or in another step.

During the anodization step, the electrolyte will fill the remaining trench, thus, the filled trench will have an electrical potential which is the same as the electrical potential inside the pores that are being formed. The horizontal component of the electrical field is cancelled between the region to be anodized 110 and the remaining trench because of the absence of difference of electrical potential. Thus, only straight and vertical pores are formed.

Figure 8:
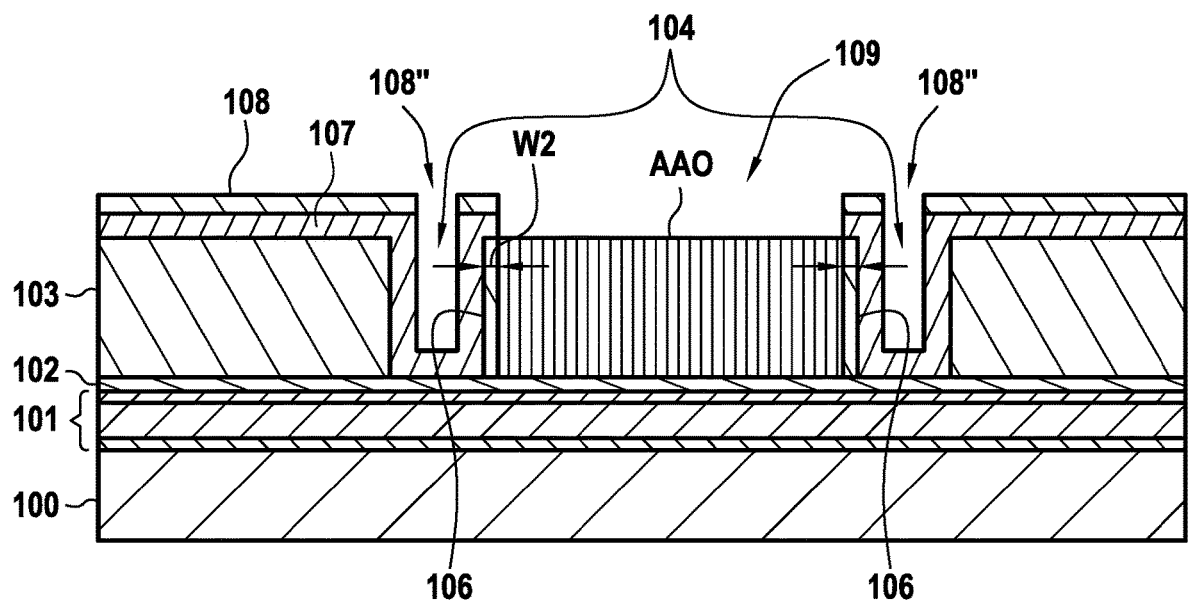

A similar effect can be achieved with the structure of FIG. 8. On this figure, a thinner hard mask 108 has been deposited, here in a conformal manner (although this is optional), so that a second remaining trench is obtained. An opening 108" is also present to allow the electrolyte to fill the second remaining trench during the anodization step.

The embodiments of FIGS. 7 and 8 are advantageous if an insulating material is used for the liner (silicon dioxide or silicon nitride), because metallic liners may be electrically connected to the electrode 101.

The invention claimed is:

1. An electrical device comprising:
    a metal barrier layer;
    an anodic porous oxide region on the metal barrier layer;
    a trench around the anodic porous oxide region reaching the metal barrier layer;
    a liner at least on a wall of the trench on a side of the anodic porous oxide region forming an electrical isolation barrier and having an opening onto the anodic porous oxide region; and
    a hard mask arranged above the trenches and the liner having at least an opening onto the anodic porous oxide region.

2. The device of claim 1, wherein the liner is arranged on both walls of the trench and on the bottom of the trench in a conformal manner.

3. The device of claim 1, wherein a thickness of the hard mask is greater than half of a width of a void in the trench at least partially filled with the liner.

4. The device of claim 1, wherein the liner is deposited so that a first remaining trench is arranged in the trench and:
    the hard mask comprises an additional opening at a level of the first remaining trench, or
    a thickness of the hard mask is chosen so that a second remaining trench is arranged in the first remaining trench.

5. The device of claim 1, wherein a aspect ratio of the trench is below 2.

6. The device of claim 1, wherein an edge of the opening of the hard mask is aligned with the wall of the trench on the side of the anodic porous oxide region or spaced by a given distance from the wall of the trench on the side of the anodic porous oxide region in a direction of a center of the anodic porous oxide region.

7. The device of claim 6, wherein the given distance is greater than 500 nanometers.

8. The device of claim 1, wherein a material of the liner is selected from silicon dioxide, silicon nitride, molybdenum, or tungsten.

9. The device of claim 1, wherein the anodic porous oxide region comprises alumina.

10. The device of claim 1, further comprising a capacitor including a first conductive layer, a first insulator layer covering the first conductive layer, and a second conductive layer covering the first insulator layer, the capacitor being inside pores of the anodic porous oxide region.

11. A method of manufacturing an electrical device comprising an anodic porous oxide region, the method comprising:
  forming an anodizable metal layer on a metal barrier layer;
  forming a trench in the anodizable metal layer around a portion of the anodizable metal layer which will include the anodic porous oxide region after anodizing, the trench reaching the metal barrier layer;
  forming a liner at least on a wall of the trench on a side of a portion of the anodizable metal layer having an opening onto the anodic porous oxide region;
  forming a hard mask above the trenches and the liner, having at least an opening onto the portion of the anodizable metal layer; and
  anodizing the portion of the anodizable metal layer so as to obtain the anodic porous oxide region and form an electrical device that includes:
    the metal barrier layer;
    the anodic porous oxide region on the metal barrier layer;
    the trench around the anodic porous oxide region and reaching the metal barrier layer;
    the liner at least on the wall of the trench on a side of the anodic porous oxide region forming an electrical isolation barrier and having the opening onto the anodic porous oxide region; and
    the hard mask arranged above the trenches and the liner having at least an opening onto the anodic porous oxide region.

12. The method of claim 11, wherein forming the liner comprises depositing the liner on both walls of the trench and on a bottom of the trench in a conformal manner.

13. The method of claim 11, wherein an edge of the opening of the hard mask is aligned with the wall of the trench on the side of the portion of the anodizable layer or spaced by a given distance (W2) from the wall of the trench on the side of the portion of the anodizable layer in the direction of a center of the portion.

14. The method of claim 11, wherein forming the liner comprises depositing silicon dioxide or silicon nitride or molybdenum or tungsten.

15. The method of claim 11, further comprising forming a capacitor including: forming a first conductive layer, forming a first insulator layer covering the first conductive layer, and forming a second conductive layer covering the first insulator layer, the capacitor being formed inside pores of the anodic porous oxide region.

* * * * *